US007109124B2

(12) United States Patent
Harper

(10) Patent No.: US 7,109,124 B2

(45) Date of Patent: Sep. 19, 2006

(54) SOLID STATE PLASMA ANTENNA

(75) Inventor: Ruth Elizabeth Harper, Rowstock (GB)

(73) Assignee: Plasma Antennas Ltd, Yarnton (GB)

(*) Notice: Subject to any disclaimer, the term of this patent is extended or adjusted under 35 U.S.C. 154(b) by 0 days.

(21) Appl. No.: 10/499,501

(22) PCT Filed: Dec. 23, 2002

(86) PCT No.: PCT/GB02/05915

§ 371 (c)(1),
(2), (4) Date: Jun. 18, 2004

(87) PCT Pub. No.: WO03/056660

PCT Pub. Date: Jul. 10, 2003

(65) Prior Publication Data

US 2005/0084996 A1 Apr. 21, 2005

(30) Foreign Application Priority Data

Dec. 21, 2001 (GB) ................................ 0130870.9

(51) Int. Cl.
*H01L 21/302* (2006.01)

(52) U.S. Cl. ...................................................... 438/726

(58) Field of Classification Search ................ 438/724, 438/729, 734, 737, 763, 905, 14, 17, 48, 438/162, 250, 257, 460, 475, 513, 584–585, 438/591, 692, 710–711, 714–716

See application file for complete search history.

(56) References Cited

U.S. PATENT DOCUMENTS 6,060,132 A * 5/2000 Lee ............................ 427/579
6,268,298 B1 7/2001 Sakata et al.
6,656,540 B1 * 12/2003 Sakamoto et al. .......... 427/564
6,660,546 B1 * 12/2003 Ezaki ........................ 29/25.03
2002/0045354 A1 * 4/2002 Ye et al. ..................... 438/720
2002/0142572 A1 * 10/2002 Sakamoto et al. .......... 438/586
2002/0164883 A1 * 11/2002 Ohmi et al. ................ 438/726

FOREIGN PATENT DOCUMENTS

EP 0 230 969 A 8/1987
JP 63 111670 A 5/1988

(Continued)

OTHER PUBLICATIONS

Golz A et al: "Fabrication of high-quality oxides on SiC by remote PECVD" Diamond and Related Materials, Elsevier Science Publishers, Amsterdam, NL, vol. 6, No. 10, Aug. 1, 1997, pp. 1420-1423.

(Continued)

*Primary Examiner*—Michael Lebentritt
*Assistant Examiner*—Andre' C. Stevenson
(74) *Attorney, Agent, or Firm*—Iandiorio & Teska

(57) ABSTRACT

A solid state electronically steerable antenna can be generated from a sheet of semiconductor material by forming a pattern of localised plasma regions in the sheet, either by injecting carriers into, or by generating carriers in, those localised regions. A suitable solid state plasma antenna can be made from a silicon wafer (10) by first thermally oxidising the surfaces and subjecting the wafer (10) to a high temperature stabilisation process to improve the stoichiometry at the silicon/silica interface, and optionally also performing a low-temperature bake in a gas mixture including hydrogen. This produces a wafer (10) with a long minority carrier lifetime. Regions of the wafer (10) in which plasma may be generated are then defined by reticulation to form isolated regions with high minority carrier lifetime. The resulting discrete regions may be of a size less than 1 mm, for example 0.3 mm.

14 Claims, 1 Drawing Sheet

FOREIGN PATENT DOCUMENTS

Figure 1:
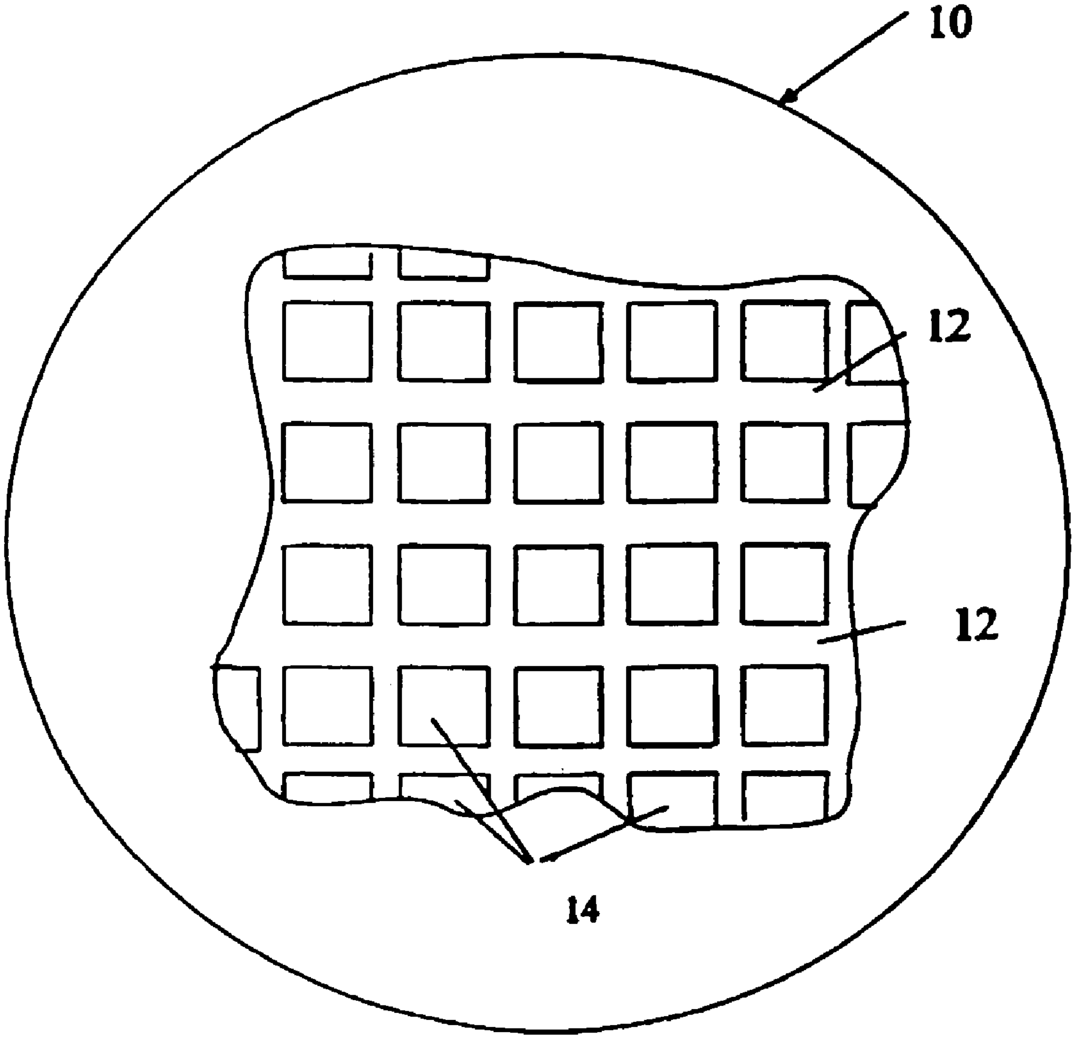

| | | |
|---|---|---|
| WO | WO 99 23719 A | 5/1999 |
| WO | WO 01 71819 A | 9/2001 |

OTHER PUBLICATIONS

Coffa S. et al: "Control of Minority Carrier Lifetime by Gold Implantation In Semiconductor Devices" Journal of the Electromechanical Society, Electrochemical Society. Manchester, N.H., US, vol. 136, No. 7, Jul. 1, 1989, pp. 2073-2075.

Stabille P J et al: "Optically Controlled Lateral Pin Diodes and Microwave Control Circuits" RCA Review, RCA Corp. Princeton, US, vol. 47, No. 4, Dec. 1, 1986, pp. 443-456.

* cited by examiner

SOLID STATE PLASMA ANTENNA

This invention relates to a solid state antenna, and to a process for its manufacture.

In the field of wireless communications, there is a desire to operate at higher frequencies, for example greater than 1 GHZ. For this purpose, it would be desirable to develop a solid state, electronically steerable antenna. One way in which this may be achieved is to form a sheet of semiconductor material with a-pattern of electrically conducting regions on its opposed surfaces, and to generate conducting plasma elements of charge carriers within the semiconductor material to couple electromagnetic radiation to or from the antenna, and to generate a pattern of such conductive elements to reflect or absorb the electromagnetic radiation. Such localised plasma elements may be created by illuminating that part of the semiconductor sheet with suitable radiation (for example infrared or visible light) of photon energy greater than the band gap (which for silicon is about 1.1 eV), or by injecting charge carriers. The solid state antenna may be, for example, that described in Patent Nos. PCT/GB01/02813 or PCT/GB02/01925.

A crucial factor in determining the power required to create and sustain such a plasma is the lifetime of the minority carrier in the semiconductor. The higher the lifetime, then the lower is the power. It is possible to obtain silicon in bulk, in which the lifetime is greater than 10 ms. However, on an untreated wafer, the surface contains a high density of dangling bonds and other electronic defects which reduce the effective lifetime to between 10 and 100 μs. The surface effects can be considerably reduced by thermal oxidation to passivate the silicon surface. There will still be defects at the silicon silica interface, but these can be minimized by subsequent treatment.

According to a non-limiting embodiment of the present invention there is provided a method of forming a solid state plasma antenna, which method comprises:

(a) selecting a semiconductor wafer, (b) subjecting surfaces of the wafer to thermal oxidation, (c) subjecting the wafer to stabilisation in a gas mixture incorporating a minor proportion of oxygen at a temperature above 800° C. to improve the stoichiometry at a silicon/silica interface, (d) and, optionally, performing a low-temperature bake in a gas mixture including hydrogen at a temperature above 300° C. to reduce interface state density;

and then localising regions of the wafer in which plasma may be generated by reticulation to form a network of isolated regions with high minority carrier lifetime, by one or more of the following steps:

(e1) selectively removing the layer developed by steps (b), (c), (d) by etching, scoring, abrading or ablation, (e2) partially or fully cutting through the wafer, for example using an anisotropic etch, a saw, a plasma etch, an ablation technique, or a laser, (e3) depositing a metal grid onto the silica surface, (e4) effecting local deposition and diffusion or implantation of a dopant such as boron or phosphorus, and (e5) effecting implantation of hydrogen, helium or gold ions.

Steps (b) and (c), and step (d) when present, may be repeated, for example after step (e).

Preferably in step (c) the gas mixture is predominantly of a non-reactive gas such as nitrogen, and the proportion of oxygen is less than 20%, by volume, for example 10% by volume. If step (d) is adopted, preferably the gas mixture incorporates a non-reactive gas such as nitrogen, and may be a mixture of equal volumes of nitrogen and hydrogen.

The method of the invention may be one wherein the cut is performed by an anistropic etch, a saw, a plasma etch, an ablation technique, or a laser.

Preferably the semiconductor is silicon. The isolated regions may be of a size of less than 1 mm. The isolated regions may form an array covering an area of the wafer.

A plasma may be generated at a selection of the isolated regions in the array, the selection being such as to focus radiation at a desired position. For example, the selected regions may be illuminated with infrared radiation so as to create an electron-hole plasma. Alternatively an array of PIN diodes may be formed on the surface or through the thickness, and may be selectively forward biased to create the desired plasma.

The invention also extends to a solid state antenna made by the method of the invention.

The invention will now be further and more particularly described, by way of example only, and with reference to FIG. 1, which shows a plan view of part of a solid state antenna.

The solid state antenna consists of a circular silicon wafer 10, of diameter 135 mm and of thickness 300 microns. The wafer 10 is made of a high quality pure silicon. The wafer 10 is subjected to thermal oxidation in an atmosphere containing oxygen, so a layer of silicon dioxide (silica) is formed over its entire surface. The wafer 10 is then subjected to a stabilisation procedure in the nitrogen atmosphere containing 10% oxygen (by volume) at a temperature of above 900° C. (e.g. 950° C.), the wafer being held in this temperature for an hour. The wafer 10 is then subjected to a bake procedure at 450° C. in an atmosphere of a nitrogen/hydrogen mixture, to reduce interface state density. The resulting wafer 10 has substantially uniform properties, and a long minority carrier lifetime, typically about 5 ms.

The upper and lower surfaces of the wafer 10 are then masked so as to define, on each surface, an identical square grid or network of lines 12 each of width of 5 μm defining squares 14 between the lines, each square 14 having sides of 200 μm. The wafer 10 is then subjected to an aqueous etching process in which the oxide layer is removed by etching from that grid or network of lines 12. Consequently the wafer 10 is subdivided into an array of square regions 14 in which the minority carrier lifetime is high, separated by the grid 12 in which the minority carrier lifetime is comparatively short.

Optical fibres (not shown) are then coupled to the upper surface of the wafer 10 so that radiation of an appropriate wavelength can be transmitted to each of the square regions. Alternatively the radiation may be supplied to the square regions 14 from a source such as a diode array or a flat screen display. If radiation is supplied to one such square region 14, of sufficient photon energy to generate charge carriers and at sufficient intensity, then in that region 14 there is created an electrically conducting plasma. Hence by supplying radiation to an array of such square regions 14, an electrically conducting region of the wafer 10 is formed, and the antenna is able to be electronically steerable. The array may be, for example, a straight line, so creating a straight line conducting region which will act as a plane mirror for incident microwaves (because the wavelength of the microwaves is much greater than the size of the discrete regions 14). Such a straight line mirror can be arranged so that radiation incident in the plane of the wafer 10 is focused at the centre of the wafer 10, and there may be an electrical feed or contact at the centre, for example an embedded pin.

It is to be appreciated that the embodiment of the invention described above with reference to the drawing has been given by way of example only and that modifications may be effected. Thus, for example, rather than having the grid of lines 12 covering the entire upper and lower surfaces of the wafer 10, the grid may instead cover only a part of the surface, for example a circular region of diameter 60 mm around the centre of the wafer 10. The wafer 10 may be of different dimensions, for example of a diameter in the range 15 mm up to 200 mm, more typically up to 150 mm; and of thickness in the range 0.1 mm up to 10 mm, preferably between 0.1 mm and 5 mm. The size of the discrete regions 14 may be different from that described above, as long as it is much less than the wavelength of the radiation to be transmitted or received by the antenna. Indeed the discrete regions might be of a different shape, for example rectangular rather than square. The discrete regions may define one or more lines, rather than covering an area. A range of different treatments may be adopted to reduce the minority carrier lifetime along the lines 12 on the wafer 10.

The invention claimed is:

1. A method of forming a solid state plasma antenna, the method comprising:

(a) selecting a semiconductor wafer, (b) subjecting surfaces of the wafer to thermal oxidation, (c) subjecting the wafer to stabilization in a gas mixture incorporating a minor proportion of oxygen at a temperature above 800° C. to improve the stoichiometry at a silicon/silica interface, (d) performing a low-temperature bake in a gas mixture including hydrogen at a temperature above 300° C. to reduce interface state density;

(e) and then localizing regions of the wafer in which plasma may be generated by reticulation to form a network of isolated regions with high minority carrier lifetime, by:

(e1) partially or fully cutting through the wafer, (e2) optionally making local deposition and diffusion or implantation of a dopant, and (e3) optionally making implantation of hydrogen, helium or gold ions.

2. A method as claimed in claim 1 wherein steps (b) and (c) are repeated, and wherein step (d) is also repeated when step (d) is present.

3. A method as claimed in claim 1 wherein in step (c) the gas mixture is predominantly of a non-reactive gas such as nitrogen, and the proportion of oxygen is less than 20% by volume.

4. A method as claimed in claim 1 including the step (d), wherein in step (d) the gas mixture incorporates a non-reactive gas.

5. A method as claimed in claim 4 in which the non-reactive gas is nitrogen.

6. A method as claimed in claim 5 in which the non-reactive gas is a mixture of equal volumes of nitrogen and hydrogen.

7. A method as claimed in claim 1 wherein the cut is preformed by an anistropic etch, a saw, a plasma etch, an ablation technique, or a laser.

8. A method as claimed in claim 1 wherein in step (e4) the dopant is boron or phosphorus.

9. A method as claimed in claim 1 wherein the semiconductor is silicon.

10. A method as claimed in claim 1 wherein the isolated regions are of size less than 1 mm.

11. A method as claimed in claim 1 wherein the isolated regions form an array covering an area of the wafer.

12. A solid state antenna made by a method as claimed in claim 1.

13. A method as claimed in claim 1 in which step (e) includes:

(e4) selectively removing the layer developed by steps (b), (c) and (d) by etching, scoring, abrading or ablation.

14. A method as claimed in claim 1 in which step (e) includes:

(e5) depositing a metal grid onto the silica surface.

* * * * *